United States Patent [19]

Bencharab et al.

[11] Patent Number: 5,073,679

[45] Date of Patent: Dec. 17, 1991

[54] SUPERCONDUCTING CONDUCTOR HAVING MULTIPLE TRANSPOSED STRANDS WITH INTERNAL COOLING CHANNELS, AND METHOD OF MANUFACTURE

[75] Inventors: Christian Bencharab, Andelnans-Froideval; Patrick Bonnet, Cravanche; Henri Nithart, Belfort, all of France

[73] Assignee: GEC Alsthom SA, Paris, France

[21] Appl. No.: 548,643

[22] Filed: Jul. 5, 1990

[30] Foreign Application Priority Data

Jul. 4, 1989 [FR] France .................. 89 08977

[51] Int. Cl.⁵ .................. H01B 12/00; H01L 39/24
[52] U.S. Cl. .................. 174/15.5; 174/15.4; 174/125.1; 505/1; 505/704; 505/885; 505/886; 29/599
[58] Field of Search .................. 174/15.5, 15.4, 125.1, 174/94 R; 505/704, 884, 885, 886; 29/599

[56] References Cited

U.S. PATENT DOCUMENTS

| | | | |
|---|---|---|---|
| 4,176,238 | 11/1979 | Vulis et al. ............ | 174/15.5 |
| 4,195,199 | 3/1980 | Hillmann et al. ....... | 174/125.1 |
| 4,506,109 | 3/1985 | Onishi et al. .......... | 174/125.1 |
| 4,763,404 | 8/1988 | Coffey et al. .......... | 29/599 |
| 4,965,245 | 10/1990 | Sugimoto et al. ...... | 505/1 |

FOREIGN PATENT DOCUMENTS 455958 7/1968 Switzerland .
0553946 4/1977 U.S.S.R. .................. 174/15.5

OTHER PUBLICATIONS

IEEE Transactions of Magnetics, vol. MAG-11, No. 2, Mar. 1975, pp. 328-331; C. R. Walters: "Magnetization and design of multistrand superconducting conductors".

Primary Examiner—Leo P. Picard
Assistant Examiner—Bot Lee Ledynh
Attorney, Agent, or Firm—Sughrue, Mion, Zinn, Macpeak & Seas

[57] ABSTRACT

A superconducting conductor comprises a first fraction of prior-tinned strands (1, 3, 5, 7, 9, etc. ...) and an additional fraction of non-prior-tinned strands (2, 4, 6, 8, 10, etc., ...). The strands of the first fraction and of the additional fraction alternate regularly and are maintained in a coherent assembly after being assembled with transposition by heating to melt the layer of tin on the prior-tinned strands, with the tin from said layer then solidifying, thus providing substantially point adherence between the previously tinned strands while leaving channels (11, 12, etc. ...) inside the superconducitng conductor for cooling liquid circulation. The invention is also to a method of manufacturing such a superconducting conductor.

4 Claims, 2 Drawing Sheets

SUPERCONDUCTING CONDUCTOR HAVING MULTIPLE TRANSPOSED STRANDS WITH INTERNAL COOLING CHANNELS, AND METHOD OF MANUFACTURE

FIELD OF THE INVENTION

The present invention relates to a superconducting conductor having multiple transposed strands with internal cooling channels.

BACKGROUND OF THE INVENTION

Superconducting conductors having multiple transposed strands of rectangular or of trapezium-shaped right cross-section and presenting good mechanical cohesion making it possible to manipulate them, and in particular making it possible to bend them edgewise as is required, in particular, if they are to be used in making magnet windings, etc. ... have already been manufactured by tinning the assembled set of transposed strands in a bath of tin or tin alloy. However, once their cross section becomes large, they become difficult to cool using a cryogenic fluid, since the fluid can come into contact only with the outside surface of a superconducting conductor and a considerable temperature gradient appears between the surface and the core thereof. Only a small number of strands may therefore be assembled together in order to ensure that acceptable cooling is maintained.

The object of the present invention is to provide a superconducting conductor having multiple transposed strands which present good mechanical cohesion, which is easily manipulated even when it has a large number of strands, but which is easily coolable by a cryogenic fluid, and also a simple method of manufacturing such a superconducting conductor.

SUMMARY OF THE INVENTION

The superconducting conductor of the invention is characterized in that it comprises a first fraction of prior-tinned strands and an additional fraction of non-prior-tinned strands, the strands of the first fraction and of the additional fraction alternating regularly and being maintained in a coherent assembly after being assembled with transposition by heating to melt the layer of tin on the tinned strands, with the tin from said layer then solidifying, thus providing substantially point adherence between the previously tinned strands while leaving channels inside the superconducting conductor for cooling liquid circulation.

Preferably, half of the strands it includes are prior tinned.

The method of the invention is characterized in that a fraction of the strands for constituting the superconducting conductor are individually tinned, in that the tinned strands are assembled with transposition with the non-tinned strands in a structure where they alternate regularly, in that the structure formed in this way is subjected to heating causing the layer of tin on the tinned strands to melt, and then in that the assembly is allowed to set by cooling into a structure provided with channels delimited by the prior-tinned strands and by the non-prior-tinned strands.

Preferably, the first fraction of strands is tinned in such a manner as to cover them with a layer of tin which is a few microns thick, such that after the tin has melted, channels remain between the strands.

A superconducting conductor of the invention and its method of manufacture are described below by way of example and with reference to the diagrammatic figures of the accompanying drawings.

BRIEF DESCRIPTION OF THE INVENTION

DESCRIPTION OF THE PREFERRED EMBODIMENT

Figure 1:
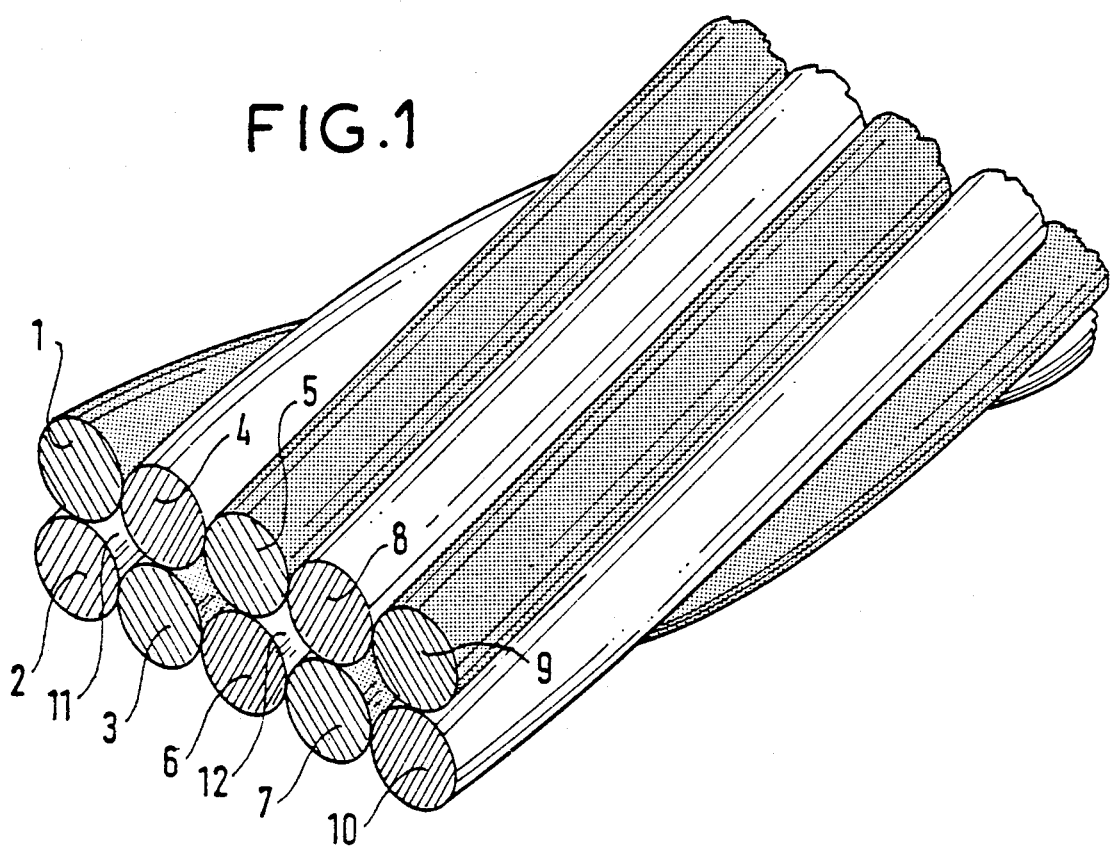
FIG. 1 is a perspective view on a magnified scale of a fraction of a superconducting conductor prior to heat treatment for melting the layer of tin on the tinned strands.

In FIG. 1, the superconductor comprises prior-tinned strands 1, 3, 5, 7, and 9 each covered with a layer of tin or tin alloy that is several microns thick, and bare, non-tinned strands 2, 4, 6, 8, and 10, with the set of strands being assembled with transposition in such a manner that in each layer there is a tinned strand between two bare strands, and vice versa. It can be seen that during subsequent heat treatment, the layer of tin on the prior-tinned strands melts and interconnects the strands at various points while leaving channels such as 11, 12 between the tinned strands and the nontinned strands. After cooling and after the tin has solidified, all of the strands are fixed together leaving channels such as 11 and 12 between them.

The superconductor formed in this way has the cohesion required for subsequent manipulation, in particular edgewise bending, while also including channels enabling a cryogenic cooling fluid to pass.

Figure 2:
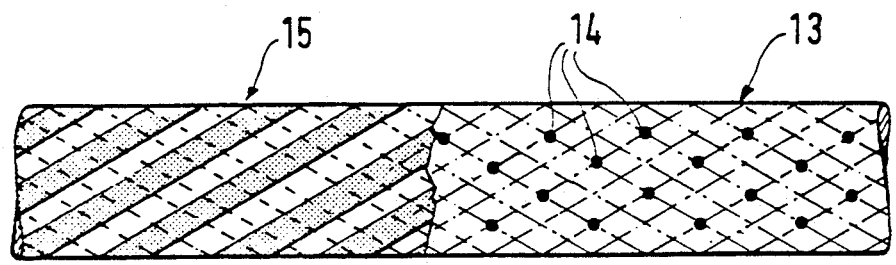
FIG. 2 is an elevation showing the internal surface of the superconductor after such heat treatment.

The righthand portion 13 of FIG. 2 is a diagram showing interconnection points 14 between strands in the cable, while its lefthand portion 15 shows the disposition of the transposed strands.

Figure 3:
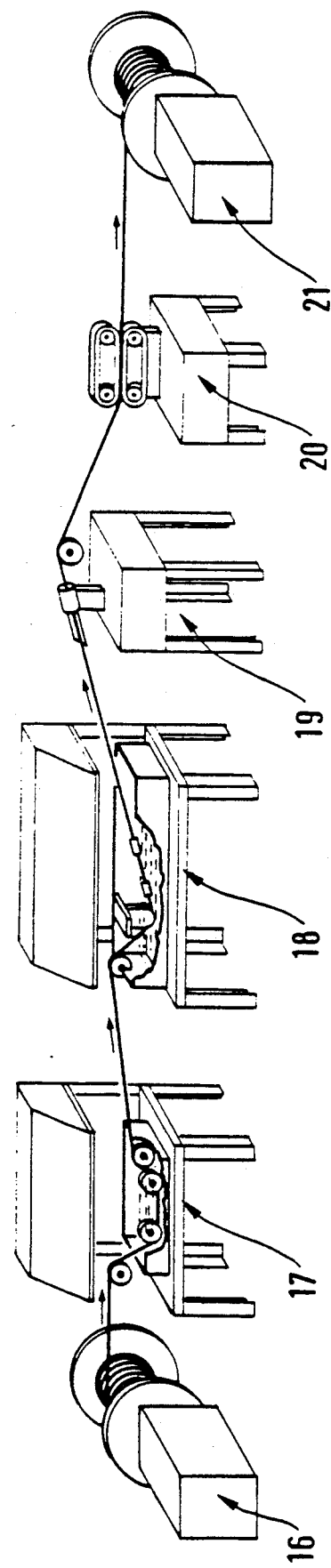
FIGS. 3 and 4 are perspective views of a line for tinning individual strands and a line for assembling strands into a superconductor, followed by bonding by melting the layer of tin.

FIG. 3 shows a line for tinning individual strands.

A superconducting strand is paid out from a machine 16 and passes through a flux bath 17, then a tinning bath 18 where it is covered with a layer of tin that is a few microns thick. Thereafter it passes through a cooling station 19, and then after pulling by a pulling station 20, it is applied to a storage drum 21.

Figure 4:
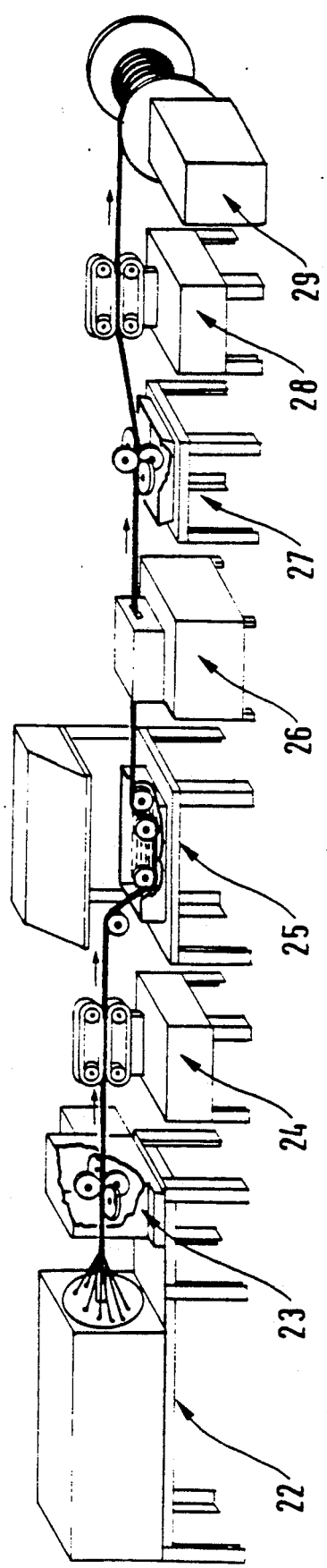

In FIG. 4, tinned and non-tinned superconducting strands dispensed from a spinner 22 pass through a "Turk's head" member 23 for assembling them with transposition. The resulting superconducting conductor is pulled by a traction station 24 and passes through a flux bath 25. On leaving this bath it passes through an oven 26 in which it is heated to a temperature higher than the melting point of tin, thereby causing the tin on the tinned strands to diffuse in part over adjacent tinned and non-tinned strands and into the interstices between strands. On leaving the oven, the superconductor passes through a calibrating and cooling "Turk's head" 27 and then after pulling by a traction station 28, it is taken up by a storage drum 29.

It is claimed:

1. A superconducting conductor comprising: a first fraction of prior-tinned strands (1, 3, 5, 7, 9, etc. ... ) and an additional fraction of non-prior-tinned strands (2, 4, 6, 8, 10, etc. ... ), said strands of the first fraction and of the additional fraction alternating regularly and within a coherent assembly being transposed and having tin melt bonded substantially point adherence between the prior-tinned strands and open channels (11, 12, etc. . . . ) inside the superconducting conductor between transposed non-prior-tinned strands for cooling liquid circulation.

2. A superconducting conductor according to claim 1, wherein in that one half of the strands are prior-tinned.

3. A method of manufacturing a superconducting conductor having multiple transposed strands with internal cooling channels, the conductor comprising a first fraction of prior-tinned strands (1, 3, 5, 7, 9, etc. . . . ) and an additional fraction of non-prior-tinned strands (2, 4, 6, 8, 10, etc. . . . ), the strands of the first fraction and of the additional fraction alternating regularly and being maintained in a coherent assembly after being assembled with transposition by heating to melt the layer of tin on the tinned strands, with the tin from said layer then solidifying, thus providing substantially point adherence between the prior-tinned strands while leaving channels (11, 12, etc. . . . ) inside the superconducting conductor for cooling liquid circulation, the method being characterized in that a fraction of the strands for constituting the superconducting conductor are individually tinned (18), in that the tinned strands are assembled with transposition (22, 23) with the non-tinned strands in a structure where they alternate regularly, in that the structure formed in this way is subjected to heating causing the layer of tin on the prior-tinned strands to melt, and then in that the assembly is allowed to set by cooling (27) into a structure provided with channels (11, 12) delimited by the prior-tinned strands and by the non-prior-tinned strands.

4. A method according to claim 3 characterized in that the first fraction of strands is tinned in such a manner as to cover them with a layer of tin which is a few microns thick.

* * * * *